United States Patent
Kim et al.

(10) Patent No.: US 7,923,365 B2
(45) Date of Patent: Apr. 12, 2011

(54) METHODS OF FORMING FIELD EFFECT TRANSISTORS HAVING STRESS-INDUCING SIDEWALL INSULATING SPACERS THEREON

(75) Inventors: Jun-jung Kim, Gyeonggi-do (KR); Sang-jine Park, Gyeonggi-do (KR); Min-ho Lee, Gyeonggi-do (KR); Thomas W. Dyer, Pleasant Valley, NY (US); Sunfei Fang, LaGrangeville, NY (US); O-sung Kwon, Wappingers Fall, NY (US); Johnny Widodo, Singapore (SG)

(73) Assignees: Samsung Electronics Co., Ltd. (KR); International Business Machines Corporation, Armonk, NY (US); Chartered Semiconductor Manufacturing, Ltd., Singapore (SG); Infineon Technologies AG (DE)

( * ) Notice: Subject to any disclaimer, the term of this patent is extended or adjusted under 35 U.S.C. 154(b) by 492 days.

(21) Appl. No.: 11/874,118

(22) Filed: Oct. 17, 2007

(65) Prior Publication Data

US 2009/0101979 A1   Apr. 23, 2009

(51) Int. Cl.
  *H01L 21/8234* (2006.01)
  *H01L 21/336* (2006.01)
(52) U.S. Cl. .......... 438/596; 438/265; 438/696
(58) Field of Classification Search .......... None
  See application file for complete search history.

(56) References Cited

U.S. PATENT DOCUMENTS

| | | |
|---|---|---|
| 6,184,157 B1 | 2/2001 | Hsu et al. |
| 6,372,589 B1 | 4/2002 | Yu |
| 6,869,866 B1 | 3/2005 | Chidambarrao et al. |
| 7,022,561 B2 | 4/2006 | Huang et al. |
| 7,052,946 B2 | 5/2006 | Chen et al. |
| 7,189,624 B2 | 3/2007 | Ito |
| 7,297,584 B2 * | 11/2007 | Park et al. ............ 438/199 |
| 7,396,718 B2 | 7/2008 | Frohberg et al. |
| 7,482,215 B2 | 1/2009 | Dyer et al. |
| 7,534,678 B2 | 5/2009 | Lee et al. |
| 2003/0040158 A1 | 2/2003 | Saitoh |
| 2004/0021160 A1 | 2/2004 | Eguchi et al. |
| 2005/0048732 A1 | 3/2005 | Park et al. |

(Continued)

FOREIGN PATENT DOCUMENTS

JP     06-163578 A     6/1994

(Continued)

OTHER PUBLICATIONS

U.S. Appl. No. 11/691,691, filed Mar. 27, 2007, Lee et al.

(Continued)

*Primary Examiner* — Zandra Smith
*Assistant Examiner* — Pamela E Perkins
(74) *Attorney, Agent, or Firm* — Myers Bigel Sibley & Sajovec

(57) ABSTRACT

Methods of forming integrated circuit devices include forming a field effect transistor having a gate electrode, a sacrificial spacer on a sidewall of the gate electrode and silicided source/drain regions. The sacrificial spacer is used as an implantation mask when forming highly doped portions of the source/drain regions. The sacrificial spacer is then removed from the sidewall of the gate electrode. A stress-inducing electrically insulating layer, which is configured to induce a net tensile stress (for NMOS transistors) or compressive stress (for PMOS transistors) in a channel region of the field effect transistor, is then formed on the sidewall of the gate electrode.

15 Claims, 5 Drawing Sheets

U.S. PATENT DOCUMENTS

| | | |
|---|---|---|
| 2005/0098829 A1 | 5/2005 | Doris et al. |
| 2005/0199963 A1 | 9/2005 | Aoyama |
| 2005/0218455 A1 | 10/2005 | Maeda et al. |
| 2005/0230756 A1 | 10/2005 | Chang et al. |
| 2006/0011586 A1 | 1/2006 | Shea |
| 2006/0019438 A1 | 1/2006 | Harakawa |
| 2006/0046400 A1 | 3/2006 | Burbach et al. |
| 2006/0081896 A1* | 4/2006 | Maeda ............... 257/288 |
| 2006/0118879 A1 | 6/2006 | Li |
| 2006/0205169 A1 | 9/2006 | Yoon et al. |
| 2007/0057324 A1* | 3/2007 | Tews et al. ............ 257/347 |
| 2007/0099360 A1 | 5/2007 | Lee et al. |
| 2007/0252230 A1 | 11/2007 | Zhu et al. |
| 2007/0257336 A1* | 11/2007 | Matsumoto ........... 257/627 |
| 2008/0026523 A1 | 1/2008 | Lee et al. |
| 2008/0050869 A1 | 2/2008 | Sudo |
| 2008/0073713 A1 | 3/2008 | Kim et al. |
| 2008/0261385 A1 | 10/2008 | Jawarani et al. |
| 2009/0101945 A1 | 4/2009 | Yamaguchi et al. |

FOREIGN PATENT DOCUMENTS

| | | |
|---|---|---|
| JP | 10-177938 | 6/1998 |
| JP | 2001-352055 | 12/2001 |
| JP | 2003-060076 A | 2/2003 |
| JP | 2003086704 | 3/2003 |
| JP | 2003-273240 | 9/2003 |
| JP | 2003273240 | 9/2003 |
| JP | 2004047608 | 2/2004 |
| JP | 2004128316 | 4/2004 |
| JP | 2005-064314 A | 3/2005 |
| JP | 2006080161 | 3/2006 |
| JP | 2006-173432 A | 6/2006 |
| JP | 2006-237070 A | 9/2006 |
| KR | 10-1997-0018691 | 4/1997 |
| KR | 100183785 | 12/1998 |
| KR | 10-2001-0076522 A | 8/2001 |
| KR | 1020020017845 A | 3/2002 |
| KR | 1020020074551 A | 10/2002 |
| KR | 1020030076354 A | 9/2003 |
| KR | 1020040070794 A | 6/2004 |
| KR | 10-2004-0107477 | 12/2004 |
| KR | 1020050049243 A | 5/2005 |
| KR | 1020060000912 A | 1/2006 |
| KR | 1020060004595 A | 1/2006 |
| KR | 1020060119773 A | 11/2006 |

OTHER PUBLICATIONS

U.S. Appl. No. 11/831,223, filed Jul. 31, 2007, Nam et al.

* cited by examiner

METHODS OF FORMING FIELD EFFECT TRANSISTORS HAVING STRESS-INDUCING SIDEWALL INSULATING SPACERS THEREON

FIELD OF THE INVENTION

The present invention relates to methods of forming integrated circuit devices and, more particularly, to methods of forming field effect transistors and transistors formed thereby.

BACKGROUND OF THE INVENTION

Generally, a metal oxide semiconductor field effect transistor (MOSFET) includes a gate electrode, which is formed on a semiconductor substrate and insulated by a thin gate insulating film, and source/drain regions formed on both sides of the gate electrode. When an appropriate bias voltage is applied to the gate electrode of the MOSFET, a channel region is formed under the gate insulating film. That is, the channel region may be formed by appropriately controlling the bias voltage applied to the gate electrode of the MOSFET.

As the integration density of semiconductor memory devices increases, memory cells are increasingly becoming smaller and faster to meet market needs. Accordingly, various methods of fabricating semiconductor devices with better performance while overcoming the limitations created by the increased integration density and speed are being studied. In particular, studies are being conducted on methods of increasing mobility of electrons or holes to implement a high-performance semiconductor device.

One of the methods of increasing mobility of electrons or holes is to apply physical stress to a channel region and thus modify the structure of an energy band of the channel region. For example, if tensile stress is applied to a channel region of an N-type transistor, the performance of the N-type transistor is enhanced. Also, the performance of a P-type transistor can be enhanced by applying compressive stress to its channel region.

SUMMARY OF THE INVENTION

Methods of forming integrated circuit devices according to embodiments of the present invention include forming a field effect transistor having a gate electrode, a sacrificial spacer on a sidewall of the gate electrode and silicided source/drain regions. The sacrificial spacer is used as an implantation mask when forming highly doped portions of the source/drain regions. The sacrificial spacer is then removed from the sidewall of the gate electrode. A stress-inducing electrically insulating layer, which is configured to induce a net tensile stress (for NMOS transistors) or compressive stress (for PMOS transistors) in a channel region of the field effect transistor, is then formed on the sidewall of the gate electrode. This stress-inducing electrically insulating layer operates to increase a mobility of charge carriers in the channel region.

According to some of these embodiments of the invention, the silicided source/drain regions include a source region having a first metal silicide layer thereon that is self-aligned to the sacrificial spacer. Moreover, the removing of the sacrificial spacer includes forming a mask layer on the field effect transistor and partially etching back the mask layer to expose the sacrificial spacer. The exposed sacrificial spacer is then selectively etched using the mask layer to protect the first metal silicide layer from etching damage. The mask layer may be a photoresist layer and the sacrificial spacer may include a nitride insulating material.

The field effect transistor may also include a second metal silicide layer on the gate electrode and the partially etching may include partially etching back the mask layer to expose the sacrificial spacer and the second metal silicide layer. According to these embodiments of the invention, the selectively etching includes exposing the second metal silicide layer to a wet and/or dry etchant. The partially etched-back mask layer may also be removed and the step of forming a stress-inducing electrically insulating layer includes depositing a stress-inducing electrically insulating layer on the second metal silicide layer.

Methods of forming integrated circuit devices according to additional embodiments of the invention may also include forming a field effect transistor having a gate electrode, a sacrificial spacer on a sidewall of the gate electrode and LDD source/drain regions, on a semiconductor substrate. Then, during subsequent processing, the sacrificial spacer is replaced with a stress-inducing electrically insulating layer that is configured to induce a net tensile or compressive stress in a channel region of the field effect transistor. According to these embodiments of the invention, the LDD source/drain regions may have silicided layers thereon and replacing the sacrificial spacer may include selectively etching the sacrificial spacer using a mask layer to protect the silicided layers from etching damage.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
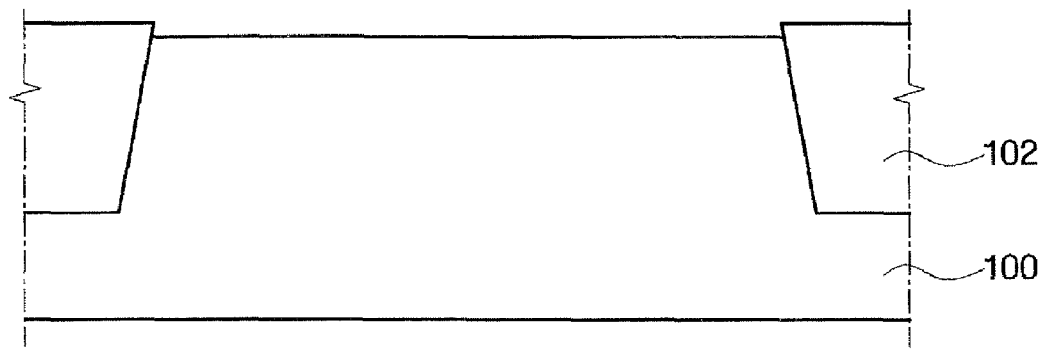
FIGS. 1 through 10 are cross-sectional views of intermediate structures that illustrate methods of fabricating semiconductor integrated circuit devices according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals in the drawings denote like elements, and thus their description will be omitted.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements thereof. In addition, the term "and/or" includes any and all combinations of one or more of the associated listed items.

Hereinafter, a method of fabricating a semiconductor integrated circuit device according to an embodiment of the present invention will be described with reference to FIGS. 1 through 10. Referring to FIG. 1, a device isolation region 102 defining an active region is formed on a semiconductor substrate 100. The semiconductor substrate 100 may be a silicon substrate, silicon on insulator (SOI) substrate, a gallium arsenide substrate, a silicon germanium substrate, a ceramic substrate, a quartz substrate or a display glass substrate, for example. In addition, the semiconductor substrate 100 may be a P-type substrate or an N-type substrate. In many cases, a P-type substrate is used as the semiconductor substrate 100. Although not shown, a P-type epitaxial layer may be grown on the semiconductor substrate 100. Although not shown, the semiconductor substrate 100 may include a P-type well doped with p-type impurities or an N-type well doped with n-type impurities. The device isolation region 102, which defines the active region and an inactive region, may be a shallow trench isolation (STI) region or a field oxide (FOX) region.

Figure 2:
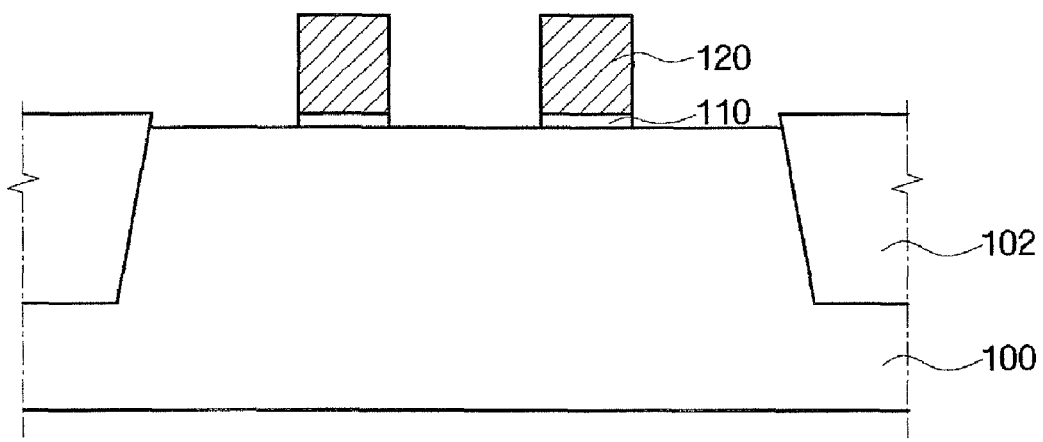

Referring to FIG. 2, a gate insulating film 110 and a gate electrode 120 are formed on the active region of the semiconductor substrate 100. Specifically, an insulating film for a gate insulating film and a conductive film for a gate electrode are sequentially deposited on the semiconductor substrate 100 and then patterned to form the gate insulating film 110 and the gate electrode 120. The gate insulating film 110 may be formed of SiOx, SiON, TiOx, TaOx, or the like. The gate insulating film 110 may be formed by chemical vapor deposition (CVD) or sputtering, for example. The gate electrode 120 is a conductor and may have a structure in which one or more of polysilicon, metal, metal silicide and metal nitride films doped with n-type or p-type impurities are stacked. The gate electrode 120 may also include a metal such as W, Co, Ni, Ti, Ta or the like.

Figure 3:
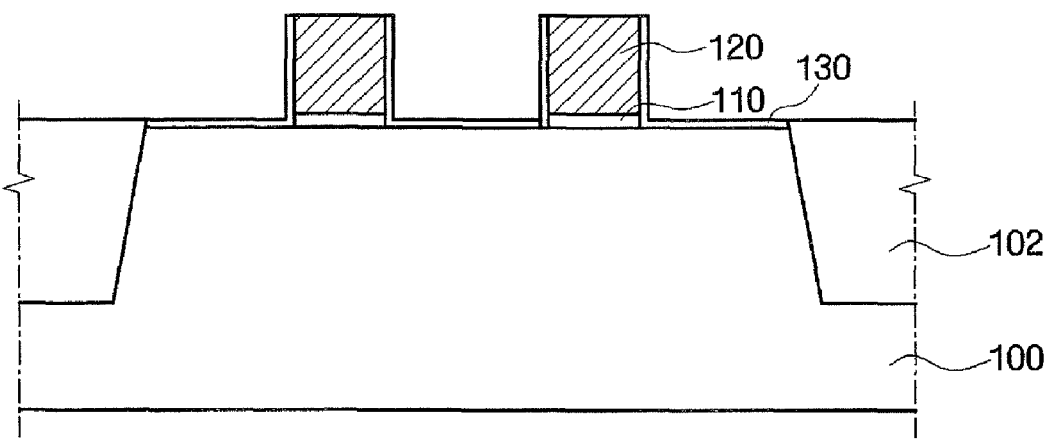

Referring to FIG. 3, a first spacer 130 is formed on side surfaces of the gate insulating film 110 and the gate electrode 120. The first spacer 130 may be formed by performing an oxidation process on the semiconductor substrate 100. The oxide film may extend along the side surfaces of the gate insulating film 110 and the gate electrode 120 and a top surface of the semiconductor substrate 100, as illustrated. The oxide film formed on the side surfaces of the gate insulating film 110 and the gate electrode 120 is the first spacer 130 and protects the side surface of the gate electrode 120. While the oxidation process for forming the first spacer 130 is performed, defects in the semiconductor substrate 100 can be reduced. Consequently, the reliability of a semiconductor device to be formed can be enhanced.

Figure 4:
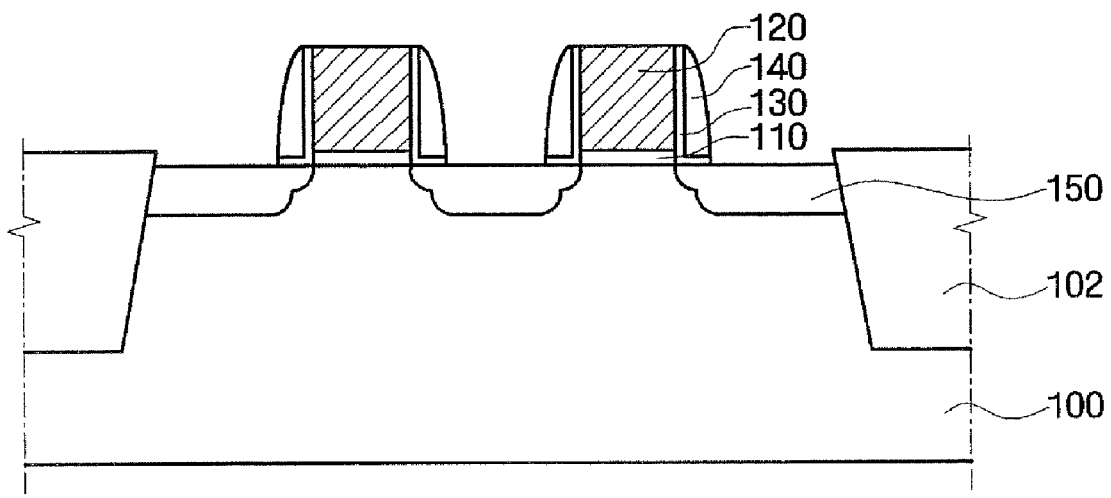

Referring to FIG. 4, a second spacer 140 is formed on a side surface of the first spacer 130, and a source/drain region 150 aligned with the gate electrode 120 is formed. Here, the source/drain region 150 may have a double diffused drain (DDD) structure or a lightly doped drain (LDD) structure. For example, in order to form the source/drain region 150 having the LDD structure, light ion-implantation is performed using the gate electrode 120 as a mask. Then, an insulating film (not shown) is conformally formed on a front surface of the semiconductor substrate 100. The insulating film may be, for example, a nitride film. The insulating film may be conformally formed on the front surface of the semiconductor substrate 100 by, for example, CVD. Next, the insulating film is anisotropically etched to form the second spacer 140 on the side surface of the first spacer 130. Then, high-concentration impurities are injected into the semiconductor substrate 100 using the second spacer 140 as a mask, thereby completing the self-aligned source/drain region 150. In the case of an N-type metal oxide semiconductor (MOS) transistor, arsenic (As) or phosphorus (P) ions can be ion-implanted using several tens of keV of energy in order to form the source/drain region 150. In the case of a P-type MOS transistor, B, $BF_2$ or $BF_3$, or In is heavily ion-implanted using several tens of keV of energy in order to form the source/drain region 150.

Figure 5:
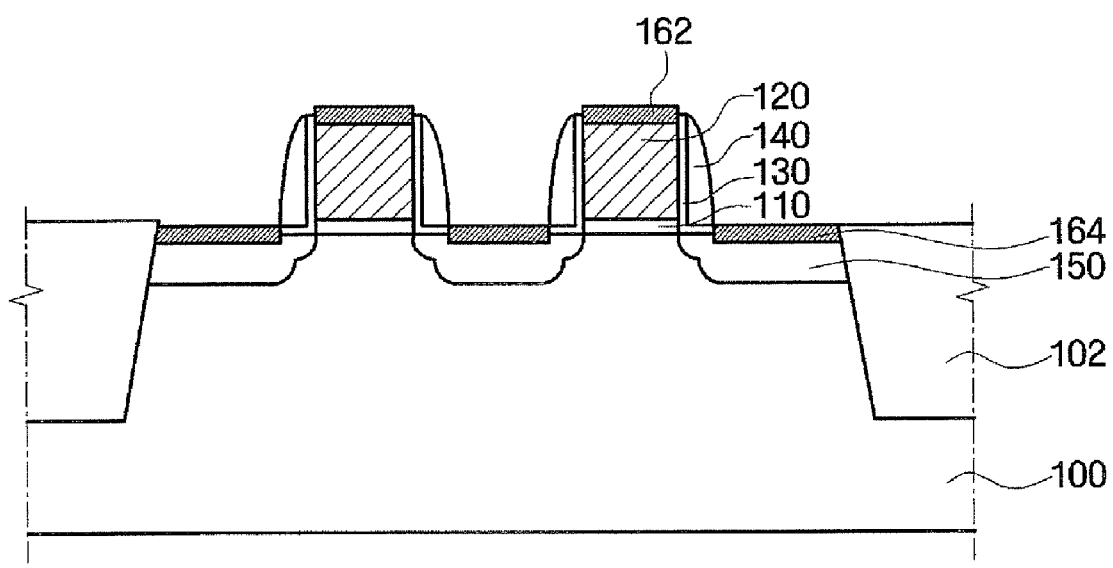

Referring to FIG. 5, silicide layers 162 and 164 are formed on the source/drain region 150 and a top surface of the gate electrode 120 in a silicide process. In order to form the silicide layers 162 and 164, a metal layer (not shown) is formed on the front surface of the semiconductor substrate 100. The metal layer may be formed of Ti, Pt, Pd, Co, Ni, or W by sputtering. Next, an annealing process for thermally treating the semiconductor substrate 100 under certain processing conditions is performed as part of the suicide process. Then, a silicide reaction occurs wherever the metal layer contacts silicon. Consequently, the silicide layers 162 and 164 are formed. Unreacted portions of the metal layer are removed through an etching or cleaning process.

Figure 6:
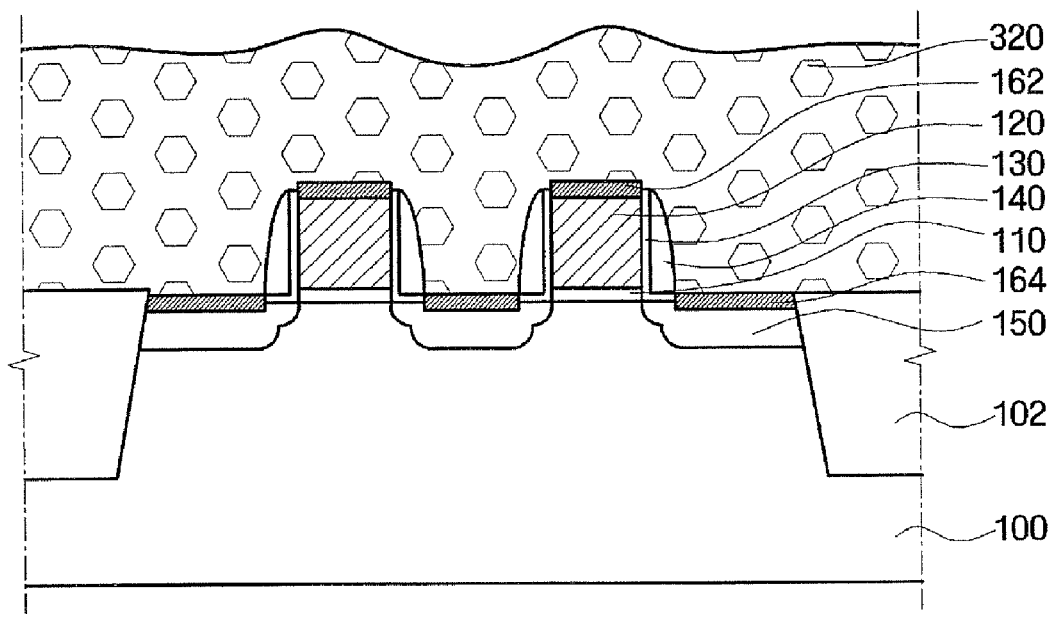

Referring to FIG. 6, a mask layer 320 is formed to completely cover the second spacer 140 and the silicide layers 162 and 164. The mask layer 320 may be formed of a material, such as photoresist, which can protect the semiconductor substrate 100 when the second spacer 140 is removed in a subsequent process.

Figure 7:
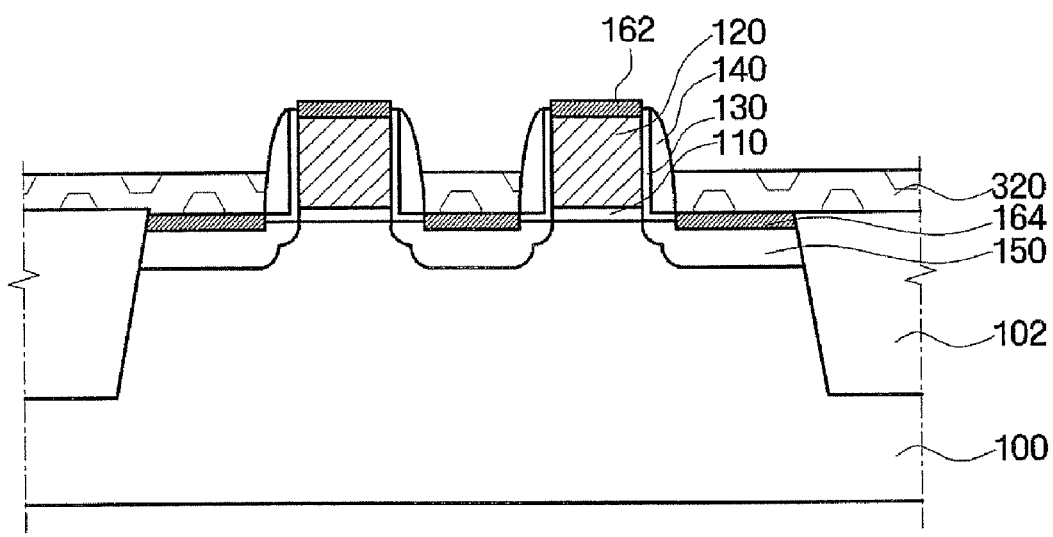

Referring to FIG. 7, the mask layer 320 is partially removed in order to expose an upper portion of the second spacer 140. The mask layer 320 may be partially removed in an etch-back process in order to expose the upper portion of the second spacer 140. Here, the mask layer 320 is partially removed so that the semiconductor substrate 100 is not exposed.

Figure 8:
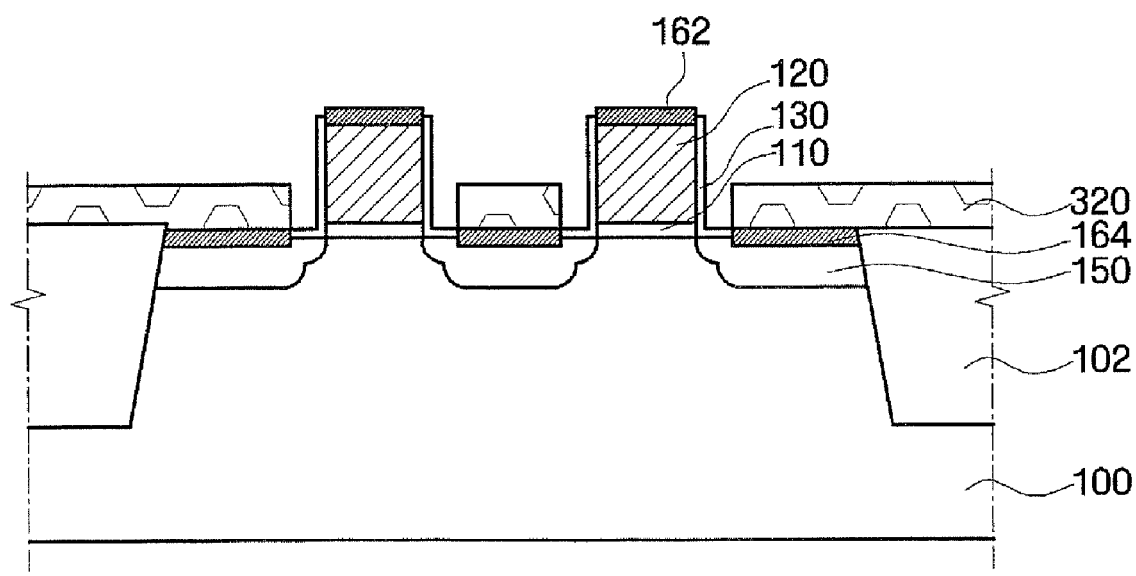

Referring to FIG. 8, the second spacer 140 is removed. The second spacer 140 may be removed by dry etching such as reactive ion etching (RIE). In this case, the second spacer 140 may be dry-etched using an etch gas which has a higher etch rate than that of the mask layer 320. Then, only the second spacer 140 can be etched while the mask layer 320 remains unetched. Alternatively, the second spacer 140 may be removed by wet etching. In this case, the second spacer 140 may be wet-etched using an etching solution, which has a higher etch rate than that of the mask layer 320.

After the mask layer 320 is formed on the semiconductor substrate 100, even if the second spacer 140 is removed, the semiconductor substrate 100 is not damaged. That is, the semiconductor substrate 100 and the silicide layer 164 formed on the source/drain region 150 of the semiconductor substrate 100 can be protected while the second spacer 140 is removed. Therefore, the surface damage of the silicide layer 164 on the source/drain region 150 is less than that of the silicide layer 162 on the top surface of the gate electrode 120. Here, the surface damage includes physical damage to surface, increased resistance, generation of leakage current, and increased hot carrier, which are caused by physical and chemical impacts due to the etching process. If the second spacer 140 is removed, the distance between a stress layer and a channel region is reduced. Therefore, when the stress layer that is to be formed in a subsequent process applies stress, the stress can be more effectively delivered to the channel region.

Figure 9:
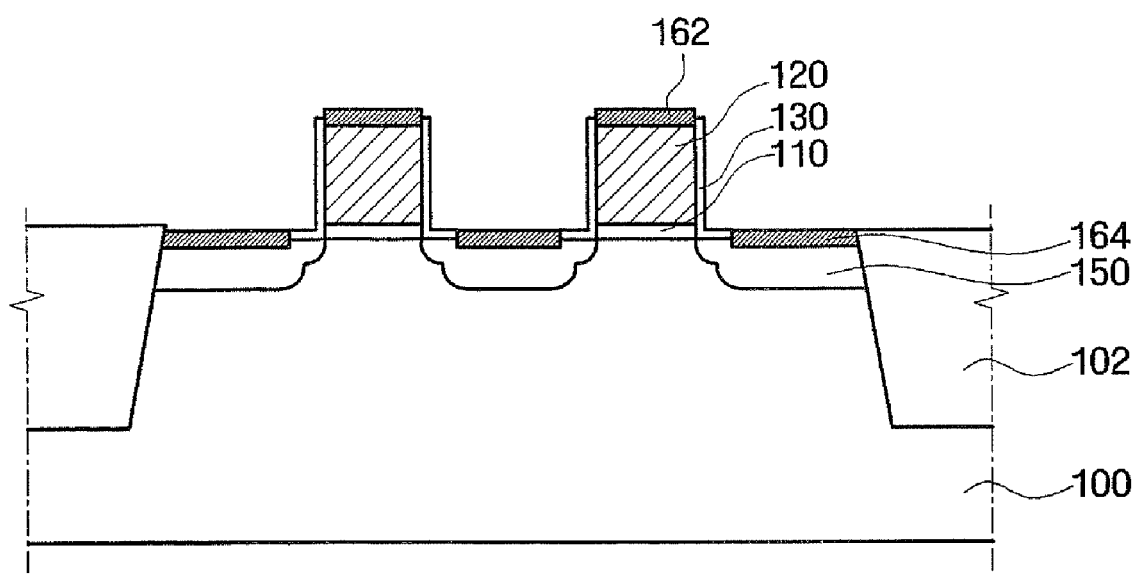

Referring to FIG. 9, the mask layer 320 is removed. The mask layer 320 may be, for example, wet-etched. Since the mask layer 320 is formed of a material such as photoresist, it can be easily removed. Therefore, the semiconductor substrate 100 is not greatly damaged when the mask layer 320 is removed.

Figure 10:
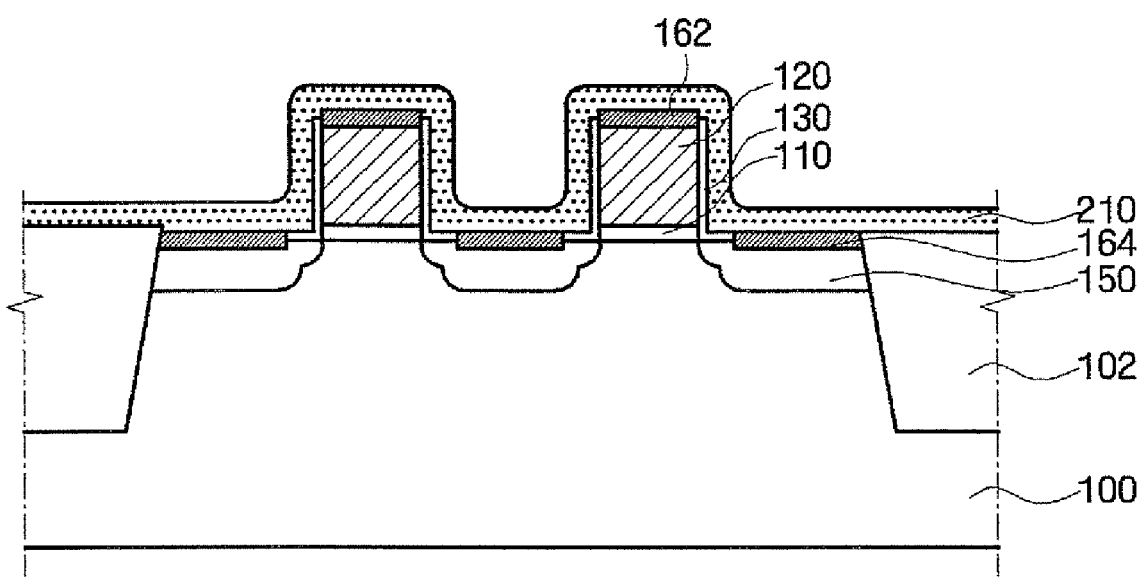

Referring to FIG. 10, a stress layer 210 is formed to cover the gate electrode 120 and the semiconductor substrate 100. The stress layer 210 may be formed of a nitride film such as SiN. The stress layer 210 may be a tensile stress layer or a compressive stress layer. The tensile stress layer may be formed by, for example, low pressure CVD (LPCVD). In addition, the compressive stress layer may be formed by, for example, plasma enhanced CVD (PECVD). The tensile stress layer or the compressive stress layer may be formed in appropriate consideration of deposition conditions such as pressure and temperature.

An N-type transistor or a P-type transistor may be formed on the semiconductor substrate 100. If the N-type transistor is formed on the semiconductor substrate 100, the stress layer 210 may be the tensile stress layer. If the P-type transistor is formed on the semiconductor substrate 100, the stress layer 210 may be the compressive stress layer.

If the stress layer 210 is formed on a transistor, it applies stress to the channel region, thereby improving characteristics of the semiconductor device. That is, if the tensile stress layer is formed on the N-type transistor, the mobility of electrons is increased. If the compressive stress layer is formed on the P-type transistor, the mobility of holes is increased. Consequently, the characteristics of the semiconductor device can be improved.

In the method of fabricating the semiconductor integrated circuit device according to the present invention, the second spacer 140 is removed, thereby reducing the distance between the stress layer 210 and the channel region. Therefore, the stress layer 210 can more effectively apply stress to the channel region.

In addition, when the second spacer 140 is removed, the mask layer 320 blocks the top surface of the semiconductor substrate 100 and thus protects the silicide layer 164 on the source/drain region 150. Therefore, an increase in the resistance of the silicide layer 164 on the source/drain region 150 and an increase in leakage current caused by the damage to the silicide layer 164 can be prevented and the reliability of the semiconductor integrated circuit device can be enhanced.

The semiconductor integrated circuit device according to the present embodiment will now be further described with reference to FIG. 10. Referring to FIG. 10, the semiconductor integrated circuit device includes the gate insulating film 110, the gate electrode 120, the source/drain region 150, the silicide layers 162 and 164, the first spacer 130, and the stress layer 210. The gate insulating film 110 is formed on the semiconductor substrate 100, and the gate electrode 120 is formed on the gate insulating film 110. The source/drain region 150 is aligned with the gate electrode 120, and the silicide layers 162 and 164 are formed on the source/drain region and the top surface of the gate electrode 120. The first spacer 130 extends from and along a side surface of the gate electrode 120 to a portion of the top surface of the semiconductor substrate 100 on which the silicide layers 162 and 164 are not formed. The stress layer 210 covers the gate electrode 120 and the semiconductor substrate 100.

Here, the surface of the silicide layer 164 on the source/drain region 150 is less damaged than that of the silicide layer 162 on a top surface of the gate electrode 120. In addition, the silicide layer 164 on the source/drain region 150 is separated a predetermined distance away from the gate electrode 120.

The first spacer 130 extending from the side surface of the gate electrode 120 is formed in a region of the semiconductor substrate 100 between the gate electrode 120 and the silicide layer 164. The first spacer 130 may be an oxide film. Here, the first spacer 130 may have a thickness similar to or less than that of the gate insulating film 110. The stress layer 210 may be a tensile stress layer or a compressive stress layer. In particular, if the N-type transistor is formed on the semiconductor substrate 100, the stress layer 210 may be the tensile stress layer. If the P-type transistor is formed on the semiconductor substrate 100, the stress layer 210 may be the compressive stress layer.

According to the semiconductor integrated circuit device of the present embodiment, since no spacer is formed on a low-concentration region of the source/drain region 150, the distance between the stress layer 210 and the channel region is reduced. Therefore, the stress layer 210 can more effectively apply stress to the channel region.

Furthermore, according to the semiconductor integrated circuit device of the present embodiment, the damage to the silicide layer 164 on the source/drain region 150 can be minimized during the processing processes. Therefore, the surface of the silicide layer 164 formed on the source/drain region 150 is less damaged than that of the silicide layer 162 formed on the gate electrode 120. Since an increase in leakage current and silicide resistance due to the damage to the silicide layer 164 on the source/drain region 150 is prevented, the semiconductor integrated circuit device with enhanced reliability can be provided.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A method of forming an integrated circuit device, comprising:
   forming a field effect transistor having a gate electrode, a sacrificial spacer on a sidewall of the gate electrode and silicided source/drain regions, on a semiconductor substrate;
   depositing a mask layer to expose at least a portion of the sacrificial spacer on the semiconductor substrate;
   removing the sacrificial spacer by selectively dry etching the exposed sacrificial spacer using the mask layer as an etching mask, said dry etching performed using an etching gas having higher etch rate for the sacrificial spacer relative to the mask layer; and
   forming a stress-inducing electrically insulating layer that is configured to induce a net tensile or compressive stress in a channel region of the field effect transistor, on the sidewall of the gate electrode.

2. The method of claim 1, wherein the silicided source/drain regions comprise source/drain regions having a first metal silicide layer thereon that is self-aligned to the sacrificial spacer.

3. The method of claim 2, wherein depositing a mask layer comprises:
   forming a mask layer on the field effect transistor; and
   partially etching back the mask layer to expose the sacrificial spacer.

4. The method of claim 3, wherein the field effect transistor comprises a second metal silicide layer on the gate electrode; and wherein partially etching comprises partially etching back the mask layer to expose the sacrificial spacer and the second metal silicide layer.

5. The method of claim 4, further comprising removing the partially etched-back mask layer; and wherein forming a stress-inducing electrically insulating layer comprises depositing a stress-inducing electrically insulating layer on the second metal silicide layer.

6. The method of claim 1, wherein the mask layer is a photoresist layer.

7. The method of claim 1, wherein the sacrificial spacer comprises a nitride insulating material.

8. The method of claim 1, wherein the mask layer covers a top surface of the source/drain region.

9. The method of claim 1, wherein the stress-inducing electrically insulating layer is a tensile stress layer.

10. The method of claim 9, wherein the field effect transistor is an N-type transistor.

11. The method of claim 1, wherein the stress-inducing electrically insulating layer is a compressive stress layer.

12. The method of claim 11, wherein the field effect transistor is a P-type transistor.

13. A method of forming an integrated circuit device, comprising:
forming a field effect transistor having a gate electrode, a sacrificial spacer on a sidewall of the gate electrode and silicided source/drain regions, on a semiconductor substrate;
depositing a mask layer to expose at least a portion of the sacrificial spacer on the semiconductor substrate;
removing the sacrificial spacer by selectively etching the exposed sacrificial spacer using the mask layer as an etchin mask; and
forming a stress-inducing electrically insulating layer that is configured to induce a net tensile or compressive stress in a channel region of the field effect transistor, on the sidewall of the gate electrode;
wherein the silicided source/drain regions comprise source/drain regions having a first metal silicide layer thereon that is self-aligned to the sacrificial spacer;
wherein depositing a mask layer comprises:
forming a mask layer on the field effect transistor; and
partially etching back the mask layer to expose the sacrificial spacer;
wherein the field effect transistor comprises a second metal silicide layer on the gate electrode;
wherein partially etching comprises partially etching back the mask layer to expose the sacrificial spacer and the second metal silicide layer; and
wherein selectively etching comprises exposing the second metal silicide layer to a wet and/or dry etchant.

14. A method of forming an integrated circuit device, comprising:
forming a field effect transistor having a gate electrode, a sacrificial spacer on a sidewall of the gate electrode and silicided source/drain regions, on a semiconductor substrate;
depositing a mask layer to expose at least a portion of the sacrificial spacer on the semiconductor substrate;
removing the sacrificial spacer by selectively etching the exposed sacrificial spacer using the mask layer as an etching mask; and
forming a stress-inducing electrically insulating layer that is configured to induce a net tensile or compressive stress in a channel region of the field effect transistor, on the sidewall of the gate electrode;
wherein the silicided source/drain regions comprise source/drain regions having a first metal silicide layer thereon that is self-aligned to the sacrificial spacer;
wherein depositing a mask layer comprises:
forming a mask layer on the field effect transistor;
partially etching back the mask layer to expose the sacrificial spacer; and
removing the partially etched-back mask layer; and
wherein forming a stress-inducing electrically insulating layer comprises depositing a stress-inducing electrically insulating layer on an upper surface and the sidewall of the gate electrode.

15. A method of forming an integrated circuit device, comprising:
forming a field effect transistor having a gate electrode, a sacrificial spacer on a sidewall of the gate electrode and LDD source/drain regions, on a semiconductor substrate; and
replacing the sacrificial spacer with a stress-inducing electrically insulating layer that is configured to induce a net tensile or compressive stress in a channel region of the field effect transistor;
wherein the LDD source/drain regions have silicided layers thereon; and
wherein replacing the sacrificial spacer comprises selectively etching the sacrificial spacer using a mask layer to protect the silicided layers from etching damage.

* * * * *